(12) United States Patent
Liou et al.

(10) Patent No.: US 6,400,634 B1
(45) Date of Patent: Jun. 4, 2002

(54) TECHNIQUE FOR INCREASING ENDURANCE OF INTEGRATED CIRCUIT MEMORY

(75) Inventors: Kong-Mou Liou, San Jose; Ting-Chung Hu, Milpitas; Ray-Lin Wan, Fremont, all of CA (US); Fuchia Shone, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/029,952

(22) PCT Filed: Dec. 23, 1997

(86) PCT No.: PCT/US97/24146
§ 371 (c)(1),
(2), (4) Date: Mar. 4, 1998

(87) PCT Pub. No.: WO99/33057
PCT Pub. Date: Jul. 1, 1999

(51) Int. Cl.[7] ................................................. G11C 8/00
(52) U.S. Cl. ............................. 365/230.03; 365/185.11; 365/185.29
(58) Field of Search ........................ 365/230.03, 185.11, 365/185.29

(56) References Cited

U.S. PATENT DOCUMENTS

| | | | |
|---|---|---|---|
| 4,963,825 A | 10/1990 | Mielke | 324/158 R |
| 5,367,484 A | 11/1994 | Alexander et al. | 365/185 |
| 5,388,083 A | 2/1995 | Assar et al. | 365/218 |
| 5,418,752 A | 5/1995 | Harari et al. | 365/218 |
| 5,526,307 A * | 6/1996 | Yiu et al. | 365/185.01 |
| 5,535,328 A | 7/1996 | Harari et al. | 395/182.05 |
| 6,219,280 B1 * | 4/2001 | Naganawa | 365/185.22 |

* cited by examiner

Primary Examiner—Son T. Dinh
(74) Attorney, Agent, or Firm—Mark A. Haynes; Haynes Beffel & Wolfeld LLP

(57) ABSTRACT

A method increases endurance of an array of memory cells which have an endurance specified according to the number of change cycles that the memory cell can endure within a performance tolerance. The method is based on arranging the array into a plurality of sectors, and assigning a subset of addresses for storage of data structure expected to change a number of times that is sufficient to exceed the specified endurance of the memory cell in the array. A record is maintained indicating one of the plurality of sectors as a current sector, directing accesses using the subset of addresses to the current sector, counting changes executed to memory cells identified by the subset of addresses for the current sector, and changing the current sector to another one of the plurality of sectors when the count of changes exceeds the threshold.

28 Claims, 4 Drawing Sheets

TECHNIQUE FOR INCREASING ENDURANCE OF INTEGRATED CIRCUIT MEMORY

BACKGROUND OF THE INVENTION

1. Field of the Invention

The present invention relates to the field of integrated circuit memory devices, such as flash memory, and more particularly to memory devices in which the memory array has an endurance specified according to a number of program and erase cycles that the memory cell can endure within a performance tolerance, and for utilizing the memory array for a greater number of cycles than that specified.

2. Description of Related Art

Integrated circuit memory devices are typically used in computer systems or other data processing systems in which there is a subset of data that is changed more often than other data stored in the memory. For example, in data processing systems which rely on sensors to provide input data, the data structure in which the sensor data is stored is updated with new sensor data more often than instructions for programs. Thus, those subsets of the memory which are used to store data structures that change often tend to fail due to the effects of the large number of change cycles that they endure.

Some integrated circuit memory architectures, such as flash memory based on floating gate memory cells, have a relatively low endurance compared to other technologies. However, the flash memory provides a non-volatile memory store which is necessary for some environments. The use of flash memory in environments requiring high endurance memory is limited by the native endurance of the memory cells on the device.

Thus, there is a need for a technique to allow utilization of a non-volatile memory devices in high change cycle environments.

SUMMARY OF THE INVENTION

The present invention provides a method for increasing endurance of an array of memory cells which have an endurance specified according to the number of change cycles that the memory cell can endure within a performance tolerance. For example, for an array of flash memory devices, floating gate memory cells in the flash memory device have an endurance specified of for example 10,000 program/erase cycles that the memory cell can safely endure. Beyond the specified number, the cell degrades, and suffers charge gain or loss caused by damage to the tunnel oxide in the cell or other damage of the memory cell.

The method is based on arranging the array into a plurality of sectors, and assigning a subset of addresses for storage of data expected to change a number of times that is sufficient to exceed the specified endurance of the memory cell in the array. According to the method, a record is maintained indicating one of the plurality of sectors as a current sector, directing accesses using the subset of addresses to the current sector, counting changes executed to memory cells identified by the subset of addresses for the current sector, and changing the current sector to another one of the plurality of sectors when the count of changes exceeds the threshold. In this way, a data structure that must be updated many times can be stored in a non-volatile memory device having limited endurance, by taking advantage of the areas in the memory array which store data that is not subject to as many change cycles.

Thus, according to one aspect the plurality of sectors include a particular sector and a number N, where N is at least 1, of substitute sector(s) in the array. The step of changing the current sector includes changing the current sector to one of the particular sector and the N substitute sector(s). The number N is greater than 1, and preferably greater than 5, and for an endurance cycling of 10 times the specified endurance, the number N is greater than or equal to 9.

According to another aspect, the method includes generating a count of erase operations to the current sector, and storing the count in a non-volatile memory store.

According to another aspect of the invention, the array is divided into a first sector, a second sector and a third sector. Other embodiments utilize more than three sectors. Addresses for accessing the array include a first subset of addresses normally assigned to the first sector, a second subset of addresses normally assigned to the second sector, and a third subset of that of addresses normally assigned to the third sector. In this embodiment, the first subset of addresses is assigned to the data structure which is expected to undergo a large number of change cycles. The process of changing the current sector according to this aspect of the invention includes directing accesses using the first subset of addresses to the current sector, accesses using the second subset of addresses to another one of the first, second and third sectors, and accesses using the third subset of addresses to a remaining one of the first, second and third sectors. The current sector is changed to another one of the first, second and third sectors when the count of changes exceeds the threshold. The changing of the current sector includes selecting a next current sector, transferring data stored in the next current sector to the current sector, and redirecting accesses using the first subset of addresses to the next current sector. Furthermore, the method includes redirecting accesses using the one of the second and third subsets of addresses that had been assigned to the next current sector to the current sector, and updating the record of the current sector to indicate the next current sector. When more than three sectors are utilized, the current sector is cycled through more than three sectors, for even greater endurance.

The present invention can also be characterized as an integrated circuit memory including an array of floating gate memory cells, in which memory cells have an endurance specified according to a number of erase cycles that the memory cell can endure within a performance tolerance. The array includes a particular sector and a number N of substitute sectors in the array. Addressing logic is coupled to the array which enables access to memory cells in the array in response to addresses in a range of addresses. The range of addresses includes a subset of addresses for accessing the particular sector in the array. The substitute sectors fall outside the normal range of addresses. Erase cycling logic is coupled to the addressing logic and the array, and maintains a record indicating one of the particular sector and the N substitute sectors as the current sector. The logic directs accesses using the subset of addresses to the current sector, counts the erases executed to memory cells identified by the subset of addresses for the current sector, and changes the current sector another one of the substitute sectors and the particular sector when the count of erases exceeds the threshold.

According to another aspect of the invention it can be characterized as integrated circuit memory in which the addressing logic enables access to memory cells in the array in response to addresses in a range of addresses that includes a first subset of addresses for accessing a first sector in the plurality of sectors, a second subset of addresses for accessing a second sector in the plurality of sectors, and a third subset of addresses for accessing a third sector in the plurality of sectors. Erase cycling logic is coupled to the addressing logic and to the array, which maintains a record indicating one of the first, second and third sectors is a current sector. The logic directs accesses using the first subset of addresses to the current sector, accesses using the second subset of addresses to another one of the first, second and third sectors and accesses using the third subset of addresses to a remaining one of the first, second and third sectors. The logic also counts changes executed in the memory cells identified by the first subset of addresses for the current sector and changes the current sector to another one of the first, second and third sectors when the count of changes exceeds a threshold.

The erase cycling logic which changes the current sector includes logic to select a next current sector to which accesses using one of the second and third subset of addresses are directed, transfers data stored in the next current sector to the current sector, signals the addressing logic to redirect accesses using the first subset of addresses to the next current sector, signals the addressing logic to redirect accesses using one of the second and third subsets of addresses to the current sector, and updates the record of the current sector to indicate the next current sector. Furthermore, the erase cycling logic includes logic which writes data from the current sector to the next current sector prior to signaling the addressing logic to redirect accesses. As mentioned before, more than three sectors can be cycled in this way for greater endurance.

Accordingly, using for example a flash memory technology specified for an endurance of 10,000 program/erase cycles, an endurance of for example 100,000 programs/erase cycles can be achieved for data structures having high change expectations according to the present invention. The present invention provides techniques which solve the problem with a tradeoff of penalty in die size and/or the time consumed in the program and erase cycling.

Other aspects and advantages of the present invention can be seen upon review of the figures, the detailed description and the claims which follow.

DETAILED DESCRIPTION

Figure 1:
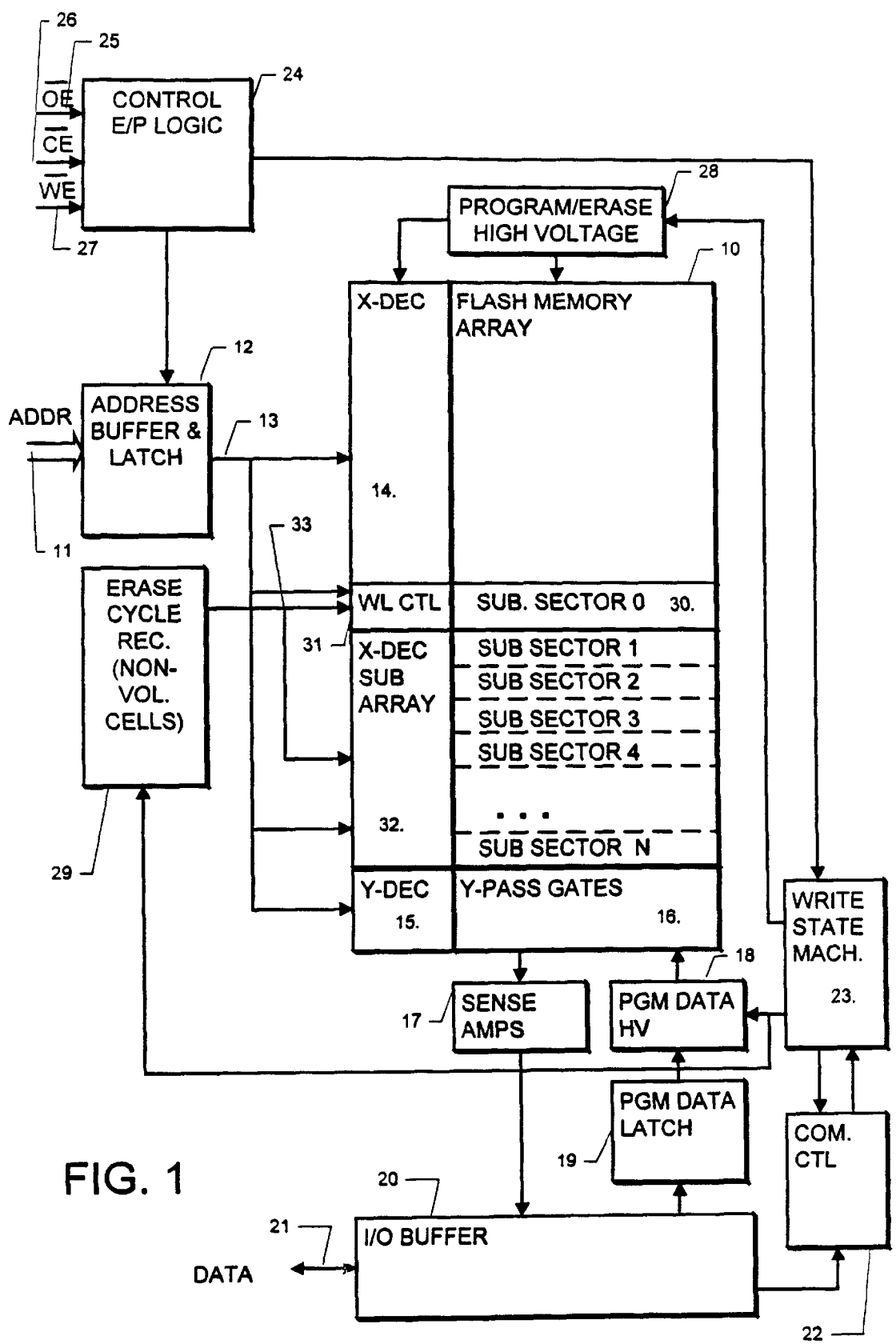
FIG. 1 is a simplified block diagram of an integrated circuit memory device according to a first embodiment of the present invention.
Figure 2:
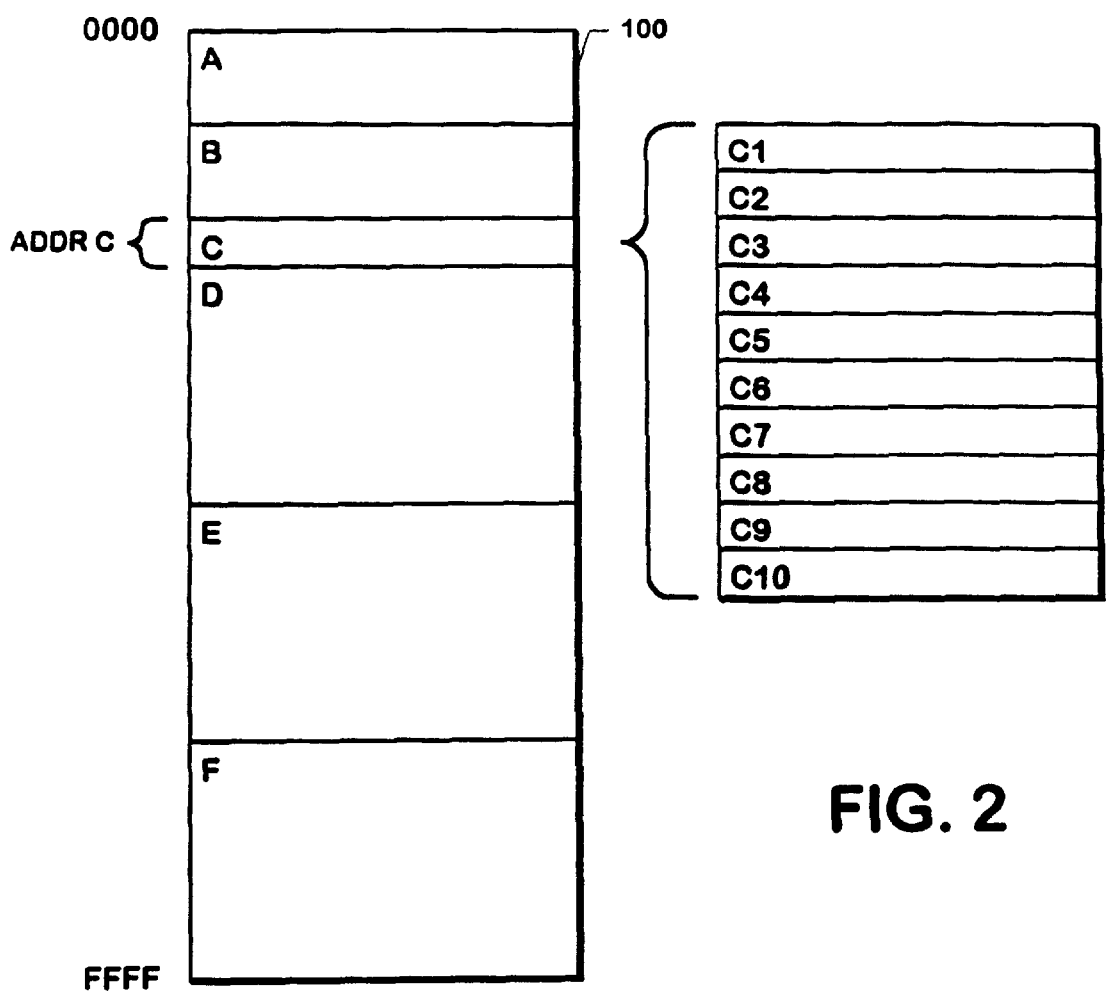
FIG. 2 is a diagram utilized for illustrating the process of controlling access to the memory array of FIG. 1.
Figure 3:
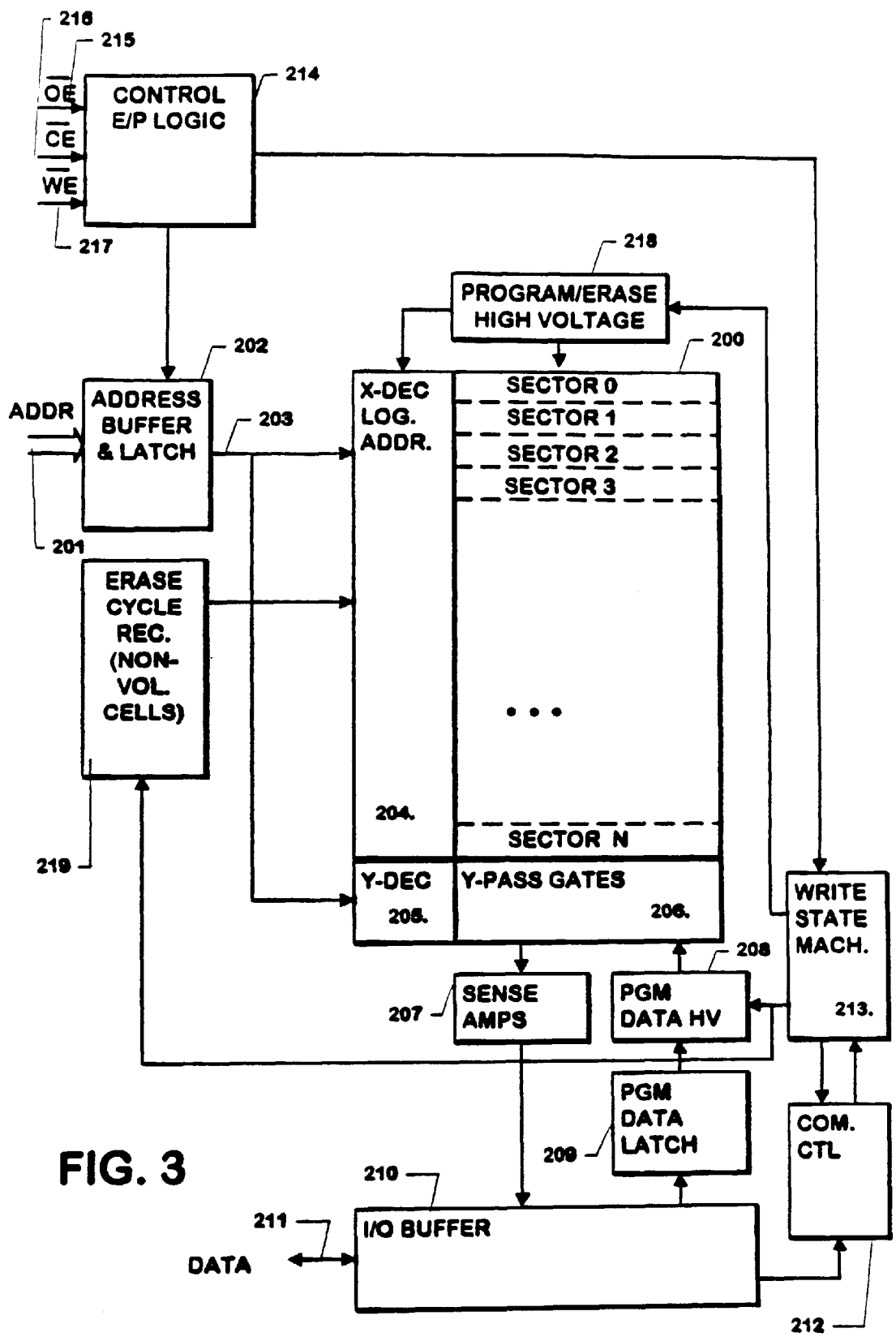
FIG. 3 is a simplified diagram of an integrated circuit memory device according to a second embodiment of the present invention.

A detailed description of the present invention is provided with respect to FIGS. 1–4, in which FIGS. 1 and 3 illustrate alternative implementations of the present invention.

FIG. 1 illustrates an integrated circuit memory device comprising an array 10 of flash memory cells. The array is implemented in one example such as described in U.S. Pat. No. 5,526,307 entitled FLASH EPROM INTEGRATED CIRCUIT ARCHITECTURE invented by Yiu, et al. The integrated circuit includes supporting circuitry including address inputs 11 coupled to address buffer and latch 12. The address buffer and latch 12 supplies address signals on line 13 to a wordline decoder 14, and a bitline decoder 15, referred to as the X decoder and Y decoder respectively. The Y decoder 15 is coupled to Y-pass gates 16 by which the bitlines are connected and disconnected to sense amplifiers 17 and program data high voltage circuits 18 used during program cycles. The program data high voltage circuits 18 are coupled to a program data latch 19 which receives data from input/output buffer 20. The sense amplifiers 17 are also coupled to the input/output buffer 20. The data I/O pins 21 are coupled to I/O buffer 20. The I/O buffer 20 is also connected to a command controller 22 which controls a write state machine 23. Other control logic for the erase and program cycling is provided in block 24. Control signal inputs for the output enable, chip enable and write enable signals are supplied on lines 25, 26 and 27 respectively. Control logic 24 controls the address buffer and latch, and the write state machine 23. Also, the write state machine 23 controls program and erase high voltage circuitry 28 which is coupled to the flash memory array 10, and to the wordline drivers 14.

According to the present invention, an erase cycle recorder 29 is provided which includes non-volatile memory cells for storing a count of erase cycles and for indicating a current sector. In this embodiment of the present invention, the flash memory array includes a plurality of sectors, including a particular sector referred to as substitute sector zero 30. N substitute sectors, referred to as substitute sectors 1–N are also included on array. Each of the substitute sectors 1–N includes the same number or a greater number of memory cells as the particular sector, sector 30. Additional logic including a wordline control logic 31, and X decoder for the substitute array 32 is provided on the chip. The wordline controller 31 and X decoder for the substitute array are controlled by the erase cycle recorder 29 as indicated on line 33 and the address buffer and latch 12 as indicated on line 13.

The memory is configured so that the particular sector, sector 30, falls within a particular subset of addresses for the flash memory array 10. The substitute sectors 1–N fall outside the normal address range. However, the X decoder for the substitute array is controllable by the wordline control logic 31 and the erase cycle recorder 33 to redirect accesses within the address range of the particular sector 30 to a current sector selected from sectors 0, that is the particular sector 30, through sector N.

This process can be logically understood with reference to FIG. 2, in which the flash memory array is represented by block 100. Block 100 includes six sectors, sectors A–F in this example. A small sector, sector 0 in this example corresponds to the particular sector 30 of FIG. 1. The substitute sectors for sector C include sectors C1–C10 in the example. Thus, accesses to the subset of addresses, ADDR C, which correspond to the sector C in the array 100 are directed to a current sector selected from the particular sector, sector C, and one of the N substitute sectors, sectors C1–C10. As a particular number of erase cycles occurs to the address range, the logic switches the current sector from sector C to the first sector in the substitute sector. After the particular number of erases happens to the first substitute sector, the logic switches to the second substitute sector and so on cycling through the substitute sectors and the particular sector.

In this way, the endurance of the memory array for the data structure stored in the sector C is multiplied by the number of good substitute sectors utilized in the cycling process. Thus for example, the erase cycling recorder includes a non-volatile register. The erase cycling recorder records every X cycles of changes to the data structure stored in the address range for the particular sector 30. For example, every 16 cycles, every 128 cycles, or every 1K erase cycles could be utilized as a counting interval. In one alternative, every erase cycle is counted in the erase cycle recorder, so that if the power off/on events occur often, erase cycles are not missed. In this alternative, every substitute sector 0-N is coupled with a counter comprising non-volatile cells, to ensure that the cells in the counter do not exceed the cycling specification. For flash memory, a write operation includes an erase followed by a program. So counting erases works to count all change cycles on a cell.

The current substitute array is disabled and the next substitute array is enabled when the erase cycling recorder reaches the threshold. The erase cycling recorder 29 is controlled by the write state machine 23. The write state machine 23 activates the non-volatile register in the erase cycling recorder at the end of the last erase cycle within the interval, that is for example at the end of the 16th, 128th or 1024th erase, so that the controller recognizes the time to disable one and enable another subarray during the access.

Accordingly, in order to achieve 100,000 cycles or more, for a specific sector based on technology constrained to 10,000 cycles on a given cell, a substitute array is provided that is transparent to the user. The substitute array is divided into ten equal sectors, each sector having a size equal to the particular sector 30 in the main array. In some applications, for example, the sectors A, B, D, E and F are provided for fixed code storage or for other data structures which are not changed frequently. Sector C, however, is provided for a data structure which may require updating up to 100,000 times.

The sector C may be part of the main array such as illustrated in FIG. 1, or alternatively, included in the set of substitute sectors, independent of the main array, depending on the particular choice of implementation.

In alternative systems, one or more of the substitute sectors C1-C10 can also be treated as a redundant sector for sector C. If sector C has a defect, then one of the sectors C1-C10 can be used to replace sector C. If C does not have a defect, the substitute sectors are used for extended endurance purposes as mentioned above. Also, sectors C1-C10 must be good sectors in order to achieve the more than 100,000 program/erase cycling in this example. Otherwise, the endurance is limited to the native endurance of the device, such as 10,000 cycles times the number of good substitute sectors on the device.

Figure 4:
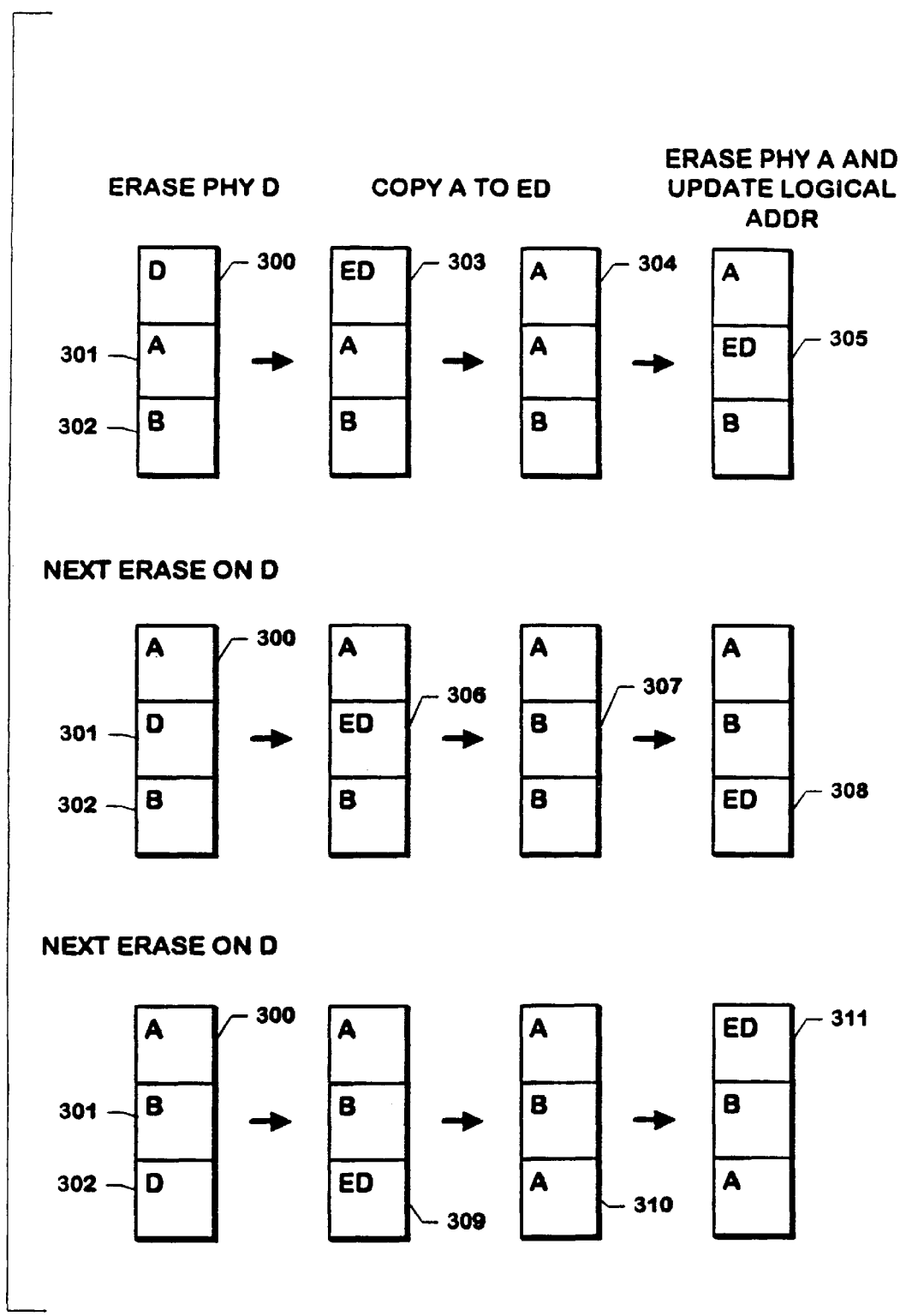
FIG. 4 is a diagram used in illustrating the process of controlling access to the memory array for the system of FIG. 3.

FIGS. 3 and 4 illustrate an alternative implementation of the present invention, in which a trade off in extended program/erase cycling time is utilized to prevent the die size penalty of the example of FIG. 1. According to the implementation of FIG. 3, an integrated circuit memory is provided with an array 200. As in FIG. 1, addresses are supplied on lines 201 to an address buffer and latch 202. The address buffer and latch 202 supplies address signals on line 203 to an X decoder 204 which includes logical addressing according to this implementation of the present invention, and to a Y decoder 205. The Y decoder is coupled to pass gates 206 for the bitlines. Pass gates connect bitlines in the array 200 to sense amplifiers 207, and to the program data high voltage circuits 208. The program data high voltage circuits 208 are coupled to a program data latch 209 which is in turn connected to input/output I/O buffers 210. Also the sense amplifiers 207 are coupled to the I/O buffers 210. Input and output data are provided on line 211. The I/O buffer 210 is also coupled to a command control block 212 which interprets commands received at the I/O buffer 210. The command control block 212 is coupled to the write state machine 213. The write state machine 213 in turn is coupled with control logic 214 for the erase and program cycling which receives the output enable, chip enable and write enable signals on lines 215, 216 and 217 respectively. Also the write state machine 213 controls the program and erase high voltage circuits 218 which are coupled to the array and to the wordline drivers in the X decoder 204. Furthermore, according to the present invention the write state machine is coupled to an erase cycle recorder 219. The erase cycle recorder 219 is coupled to the X decoder 204 to control the logical addressing to implement the endurance cycling of the present invention. The process of managing endurance cycling according to this embodiment can be understood with reference to FIG. 4. According to this example, the array includes a plurality of sectors, sectors 0-N as illustrated in the figure. In this example, three of the sectors are utilized. Thus, sectors 1, 2 and 3 can be utilized to improve erase cycling endurance for a particular data structure. In FIG. 4, a first erase process on the data structure D is illustrated where the data structure is stored in the sector 1, 300, other data A is stored in the second sector 301, and yet other data B is stored in a third sector 302. The erase cycle recorder controls the logical addressing in the X decoder 204 to execute the process which involves first erasing the physical sector in which the data structure D is stored to generate a physical sector having an erased data structure, ED as indicated at 303. Next, the data from A from the physical sector 301 is copied to the physical sector 300 as indicated at 304. Finally, the physical sector which had stored data A is erased, and the logical addressing is updated so that the physical sector 301 corresponds to the erased data structure D as indicated at 305. Finally, the data structure D is restored to the physical sector 305.

On the next erase or after X erase cycles recorded by erase cycle recorder 219 on the data structure D, data A is stored in the first sector 300, the data structure D is stored in the second sector 301, and the data B is stored in the third sector 302. The process first erases the sector storing the data structure D is indicated at 306. Next, the data B from the third sector 302 is copied to the physical sector having the erased data structure as indicated at 307. Lastly, the third sector 302 is designated the sector for storing the data structure D as indicated at 308.

On a next erase cycle or after X erase cycles recorded by erase cycle recorder 219 for the data structure D, the data A is stored in the first sector 300, the data B is stored in the second sector 301, and the data structure D is stored in the third sector 302. First, the third sector is erased as indicated at 309 to provide an erased physical sector. The data A from the first sector is copied to the third sector as indicated at 310. Finally, the first sector is erased and designated as the physical sector for the data structure D as indicated at 311.

Following this cycling technique, the effective endurance of the memory array for storing a data structure D is increased, by taking advantage of the relatively low erase cycling which occurs in the data A and B.

Accordingly, this alternative implementation achieves the same purpose with a tradeoff that involves extended erase time in order to hide the swap with dynamic addressing algorithm explained above with respect to FIGS. 3 and 4. This algorithm utilizes the rarely used program/erase life of other sectors in the array to distribute the wear of the target sector that requires the extended cycling. The penalties of this approach are extended erase time, and overhead of dynamic addressing in order to apply the correct addressing to the current sector.

Accordingly, the present invention provides an integrated circuit memory device including an array of memory cells that have a native endurance. However, techniques are provided for storing a data structure in the device which can be changed more times than the native endurance allows, by using substitute sectors, and/or logical addressing schemes to take advantage of the relatively low cycling endured by other sectors in the array.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A method for increasing endurance of an array of memory cells, the memory cells in the array having an endurance specified according to a number of change cycles that the memory cell can endure within a performance tolerance, comprising:
   arranging the array into a plurality of sectors;
   assigning a subset of addresses for storage of data expected to change a number of times sufficient to exceed the specified endurance of the memory cells in the array; and
   maintaining a record indicating one of the plurality of sectors as a current sector, directing accesses using the subset of addresses to the current sector, counting changes executed to memory cells identified by the subset of addresses for the current sector, and changing the current sector to another one of the plurality of sectors when the count of changes exceeds a threshold.

2. The method of claim 1, wherein the plurality of sectors include a particular sector and a number N, where N is at least one, of substitute sector(s) in the array, the changing the current sector includes changing the current sector to one of the particular sector and the N substitute sector(s).

3. The method of claim 2, wherein the number N is greater than 1.

4. The method of claim 2, wherein the number N is greater than 5.

5. The method of claim 2, wherein the number N is greater than or equal to 9.

6. The method of claim 1, wherein the memory cells in the array comprise floating gate memory cells.

7. The method of claim 6, wherein the change cycles comprise an erase of the current sector followed by a program of the current sector.

8. The method of claim 7, including generating a count of erase operations to the current sector, and storing the count in a non-volatile store.

9. The method of claim 1, wherein the step of maintaining a count includes providing a plurality of non-volatile stores, the plurality of non-volatile stores being coupled with respective sectors in the plurality of sectors, and storing the count for the current sector in the non-volatile store coupled with the current sector.

10. The method of claim 1, wherein addresses for accessing the array include a first subset of addresses for accessing a first sector in the plurality of sectors, a second subset of addresses for accessing a second sector in the plurality of sectors, and a third subset of addresses for accessing a third sector in the plurality of sectors; and wherein the assigned subset of addresses is first subset of addresses, and wherein the record indicates one of the first, second and third sectors as the current sector, and the changing of the current sector includes
   directing accesses using the first subset of addresses to the current sector, accesses using the second subset of addresses to another one of the first, second and third sectors and accesses using the third subset of addresses to a remaining one of the first, second and third sectors, and
   changing the current sector to another one of the first, second and third sectors when the count of changes exceeds a threshold.

11. The method of claim 10, wherein the changing of the current sector includes selecting a next current sector, transferring data stored in the next current sector to the current sector, and redirecting accesses to using the first subset of addresses to the next current sector.

12. The method of claim 10, wherein the changing of the current sector includes selecting a next current sector to which accesses using one of the second and third subset of addresses are directed, transferring data stored in the next current sector to the current sector, redirecting accesses to using the first subset of addresses to the next current sector, redirecting accesses using the one of the second and third subsets of addresses to the current sector, and updating the record of the current sector to indicate the next current sector.

13. An integrated circuit memory, comprising:
   an array of floating gate memory cells, the memory cells in the array having an endurance specified according to a number of change cycles that the memory cell can endure within a performance tolerance;
   the array including a particular sector and a number N, where N is at least one, of substitute sector(s) in the array, the substitute sector(s) including a number of memory cells equal to or greater than the number of cells in the particular sector in the array;
   addressing logic, coupled to the array, which enables access to memory cells in the array in response to addresses in a range of addresses, and wherein the range of addresses includes a subset of addresses for accessing the particular sector of the array; and
   array cycling logic, coupled to the addressing logic and the array, which maintains a record indicating one of the particular sector and the N substitute sector(s) as a current sector, directs accesses using the subset of addresses to the current sector, counts changes executed to memory cells identified by the subset of addresses for the current sector, and changes the current sector to another one of the substitute sector(s) and the particular sector when the count of erases exceeds a threshold.

14. The integrated circuit memory of claim 13, wherein the number N is greater than 1.

15. The integrated circuit memory of claim 13, wherein the number N is greater than 5.

16. The integrated circuit memory of claim 13, wherein the number N is greater than or equal to 9.

17. The integrated circuit memory of claim 13, wherein change cycles to the array comprise an erase of the accessed sector followed by a program of the accessed sector, and the erase operation in the write cycles is counted by the array cycling logic as an erase cycle.

18. The integrated circuit memory of claim 13, wherein the array cycling logic includes logic which generates a count of erase operations to the current sector, and stores the count in a non-volatile store.

19. The integrated circuit memory of claim 17, wherein the non-volatile store comprises a non-volatile memory on the integrated circuit.

20. The integrated circuit memory of claim 13, including a plurality of non-volatile stores coupled with respective sectors in the plurality of sectors, and wherein the array cycling logic includes logic which generates a count of erase operations to the current sector, and stores the count in the non-volatile store coupled with the current sector.

21. An integrated circuit memory, comprising:

an array of floating gate memory cells, the memory cells in the array having an endurance specified according to a number of change cycles that the memory cell can endure within a performance tolerance, the array including a plurality of sectors;

addressing logic, coupled to the array, which enables access to memory cells in the array in response to addresses in a range of addresses, and wherein the range of addresses includes a first subset of addresses for accessing a first sector in the plurality of sectors, a second subset of addresses for accessing a second sector in the plurality of sectors, and a third subset of addresses for accessing a third sector in the plurality of sectors; and array cycling logic, coupled to the addressing logic and the array, which maintains a record indicating one of the first, second and third sectors as a current sector, directs accesses using the first subset of addresses to the current sector, accesses using the second subset of addresses to another one of the first, second and third sectors and accesses using the third subset of addresses to a remaining one of the first, second and third sectors, counts changes executed to memory cells identified by the first subset of addresses for the current sector, and changes the current sector to another one of the first, second and third sectors when the count of changes exceeds a threshold.

22. The integrated circuit memory of claim 21, wherein the array cycling logic which changes the current sector includes logic to select a next current sector, transfer data stored in the next current sector to the current sector, and signal the addressing logic to redirect accesses to using the first subset of addresses to the next current sector.

23. The integrated circuit memory of claim 21, wherein the array cycling logic which changes the current sector includes logic to select a next current sector to which accesses using one of the second and third subset of addresses are directed, transfer data stored in the next current sector to the current sector, signal the addressing logic to redirect accesses to using the first subset of addresses to the next current sector, signal the addressing logic to redirect accesses using the one of the second and third subsets of addresses to the current sector, and update the record of the current sector to indicate the next current sector.

24. The integrated circuit memory of claim 23, wherein the array cycling logic which changes the current sector includes logic to erase the next current sector prior to signaling the addressing logic to redirect accesses.

25. The integrated circuit memory of claim 21, wherein change cycles comprise an erase of the accessed sector followed by a program of the accessed sector, and the array cycling logic counts the erase operation within a change cycle as a change cycle.

26. The integrated circuit memory of claim 21, wherein the array cycling logic includes logic which generates a count of change operations to the current sector, and stores the count in a non-volatile store.

27. The integrated circuit memory of claim 26, wherein the non-volatile store comprises a non-volatile memory on the integrated circuit.

28. The integrated circuit memory of claim 21, including a plurality of non-volatile stores coupled with respective sectors in the plurality of sectors, and wherein the array cycling logic includes logic which generates a count of erase operations to the current sector, and stores the count in the non-volatile store coupled with the current sector.

* * * * *